(12) United States Patent
Alberth, Jr. et al.

(10) Patent No.: US 6,349,216 B1
(45) Date of Patent: Feb. 19, 2002

(54) LOAD ENVELOPE FOLLOWING AMPLIFIER SYSTEM

(75) Inventors: William P. Alberth, Jr., Crystal Lake; Armin Klomsdorf, Spring Grove; Luke Winkelmann, Mundelein, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/359,586

(22) Filed: Jul. 22, 1999

(51) Int. Cl.[7] .............................. H04R 1/38; H04M 1/00

(52) U.S. Cl. .................... 455/550; 455/104; 455/107; 455/126; 455/115; 455/127; 375/296; 375/297

(58) Field of Search ............................... 455/104, 107, 455/571, 108, 572, 115, 116, 550, 127, 126; 375/297, 296

(56) References Cited

U.S. PATENT DOCUMENTS

| | | |
|---|---|---|
| 4,041,395 A | 8/1977 | Hill |
| 4,147,985 A | 4/1979 | Rogers |
| 4,165,493 A | 8/1979 | Harrington |
| 4,348,644 A | 9/1982 | Kamiya |
| 4,356,458 A | 10/1982 | Armitage |
| 4,370,622 A | 1/1983 | Hornbeck et al. |
| 4,442,407 A | 4/1984 | Apel |
| 4,546,313 A | 10/1985 | Moyer |
| 4,647,871 A | 3/1987 | Turner, Jr. |
| 4,827,219 A | 5/1989 | Harrison |
| 4,890,062 A | 12/1989 | Haragashira |
| 4,924,191 A | 5/1990 | Erb et al. |
| 4,985,686 A | 1/1991 | Davidson et al. |
| 4,990,866 A | 2/1991 | Martheli |
| 4,994,757 A | 2/1991 | Bickley et al. |
| 5,060,294 A | 10/1991 | Schwent et al. |
| 5,101,172 A | 3/1992 | Ikeda et al. |
| 5,113,414 A | 5/1992 | Karam et al. |
| 5,119,040 A | * 6/1992 | Long et al. .................. 330/149 |
| 5,170,496 A | 12/1992 | Viereck |
| 5,195,045 A | 3/1993 | Keane et al. |
| 5,220,276 A | 6/1993 | Kleefstra |
| 5,251,330 A | 10/1993 | Chiba et al. |
| 5,251,331 A | * 10/1993 | Schwent et al. ............ 455/127 |
| 5,276,912 A | 1/1994 | Siwiak et al. |
| 5,278,997 A | 1/1994 | Martin |
| 5,300,894 A | 4/1994 | Myer et al. |
| 5,302,914 A | 4/1994 | Arntz et al. |
| 5,329,244 A | 7/1994 | Fujita et al. |
| 5,339,041 A | 8/1994 | Nitardy |
| 5,351,016 A | 9/1994 | Dent |
| 5,361,403 A | 11/1994 | Dent |
| 5,408,691 A | 4/1995 | Takao |
| 5,420,536 A | 5/1995 | Faulkner et al. |
| 5,428,828 A | 6/1995 | Pugel et al. |
| 5,483,680 A | 1/1996 | Talbot |

(List continued on next page.)

FOREIGN PATENT DOCUMENTS

EP     0685936 A2   12/1995

*Primary Examiner*—William Trost
*Assistant Examiner*—Marceau Milord
(74) *Attorney, Agent, or Firm*—Paul J. Bartusiak; Randall S. Vaas

(57) ABSTRACT

A load envelope following (LEF) amplifier system to increase the efficiency of amplification systems that employ linear modulation schemes. The LEF system has a signal amplifier for receiving an input signal that has an amplitude modulation (AM) envelope. The signal amplifier produces an amplified version of the input signal. A variable impedance network is coupled to an output of the signal amplifier and substantially continuously presents various impedances to the output of the signal amplifier in response to a load control signal. An envelope mapping circuit is coupled to the variable impedance network to produce the load control signal in response to and indicative of the substantially continuously varying amplitude of the AM envelope of the input signal.

25 Claims, 6 Drawing Sheets

U.S. PATENT DOCUMENTS

| | | | |
|---|---|---|---|
| 5,553,318 A | * 9/1996 | Ohmagari et al. | 455/126 |
| 5,564,086 A | 10/1996 | Cygan et al. | |
| 5,589,796 A | 12/1996 | Alberth, Jr. et al. | |
| 5,598,127 A | 1/1997 | Abbiati et al. | |
| 5,640,691 A | 6/1997 | Davis et al. | |
| 5,673,001 A | 9/1997 | Kim et al. | |
| 5,694,433 A | * 12/1997 | Dent | 375/297 |
| 5,742,201 A | 4/1998 | Eisenberg et al. | |
| 5,880,633 A | * 3/1999 | Leizerovich et al. | 330/84 |
| 5,901,346 A | * 5/1999 | Stengel et al. | 455/126 |
| 5,905,407 A | * 5/1999 | Midya | 330/10 |
| 5,907,797 A | * 5/1999 | Hanatatsu et al. | 455/115 |
| 6,020,787 A | * 2/2000 | Kim et al. | 330/279 |
| 6,069,525 A | * 5/2000 | Sevic et al. | 330/51 |
| 6,141,541 A | * 12/2000 | Midya et al. | 455/91 |
| 6,160,449 A | * 12/2000 | Klomsdorf et al. | 330/149 |
| 6,166,598 A | * 12/2000 | Schlueter | 330/127 |

* cited by examiner

LOAD ENVELOPE FOLLOWING AMPLIFIER SYSTEM

CROSS REFERENCE TO RELATED APPLICATION

This application is related to co-pending U.S. patent applications Ser. No. 09/359,280 Jul. 22, 1999 filed herewith by Alberth et al. and entitled "LOAD ENVELOPE ELIMINATION AND RESTORATION AMPLIFIER SYSTEM," Ser. No. 09/359,225 filed Jul. 22, 1999 by David Schlueter and entitled "POWER AMPLIFYING CIRCUIT WITH SUPPLY ADJUST TO CONTROL ADJACENT AND ALTERNATE CHANNEL POWER," Ser. No. 09/358,674 Jul. 22, 1999 filed herewith by Klomsdorf et al. and entitled "MEMORY-BASED AMPLIFIER LOAD ADJUST SYSTEM," and Ser. No. 09/358,884 filed Jul. 22, 1999 by Klomsdorf et al. and entitled "POWER AMPLIFYING CIRCUIT WITH LOAD ADJUST FOR CONTROL OF ADJACENT AND ALTERNATE CHANNEL POWER."

FIELD OF THE INVENTION

This invention generally relates to a high efficiency power amplifier system. More specifically, this invention relates to a load envelop following (LEF) amplifier system for efficient amplification in a linear modulation scheme.

BACKGROUND OF THE INVENTION

The rapid and great increase in the cellular phone use has resulted in a shortage of frequency spectrum for handling all of the cellular customers. This shortage has prompted a migration towards more spectrally efficient, digital modulation schemes that have higher user capacities. Examples of such modulation schemes include Interim Standard (IS)-136 Time Division Multiple Access (TDMA), Personal Digital Cellular, IS-95 based Code Division Multiple Access, Global System for Mobile communications (GSM) and TDMA Edge. In addition, newer and even higher data rate capacity systems are being proposed and developed for third generation cellular systems.

The digital cellular systems usually require linear modulation, and while the linear modulation does facilitate higher system capacity, it also results in lower efficiency power amplifiers. Power amplifiers continue to consume a significant percentage of the overall current drain of the portable radiotelephones used in cellular communication systems. The higher the current drain, the less talk time and stand-by time that is available, since the battery for the portable radiotelephone will be drained faster. Thus, the efficiency of the power amplifiers used in portable radiotelephones is a critical parameter; the higher the efficiency, the less current the power amplifier consumes and the more talk/stand-by time is available for the portable radiotelephone. Several techniques have been proposed to improve the efficiency of power amplifiers linear modulation systems.

One technique for improving the efficiency of power amplifiers is Envelope Elimination and Restoration (EER). EER was first proposed by Leonard Kahn in 1952 (July Proceedings of the I.R.E. page 803–806). An example block diagram of a power amplifier (PA) EER system is depicted in FIG. 1. The PA EER system 100 includes a limiter 2 coupled to a power amplifier 4, and the power amplifier 4 coupled to antenna 14. The PA EER system 100 further includes a voltage supply control circuit 6 coupled to the power amplifier 4 through a filter 8.

In a many digital cellular systems, the information bearing radio frequency signal contains both amplitude modulation (AM) and phase modulation (PM) components. An RF signal with AM and PM components appearing at input 12 is processed by the limiter 2. The limiter 2 removes all AM information and passes a constant envelope signal to the power amplifier 4. The limiter can be a simple limiting RF amplifier.

In addition, an envelope signal appearing at input 16 contains information about the RF signal envelope of the RF signal that appears at input 12. The envelope signal is applied to the voltage supply control circuit 6. Finally, a substantially constant supply voltage is applied to the voltage supply control circuit 6 at input 10. The voltage supply control circuit 6 along with filter 8 comprises a switching power supply that modulates the supply voltage appearing at input 10 in response to the envelope signal appearing at input 16. The voltage supply control circuit 6 and the filter 8 thus supply a varying voltage signal on line 18 that varies according to the AM envelope of the RF signal originally appearing at input 12. By modulating the supply voltage to the power amplifier, the desired AM envelope is impressed on the output signal of the power amplifier, and the resultant signal with the restored AM envelope is transmitted through antenna 14. Since the AM of the RF input signal appearing at input 12 is removed, the PA EER system 100 allows the power amplifier 4 to operate as a very efficient class C amplifier. All of the AM information is impressed upon the output signal of the power amplifier by the changes in the power amplifier supply voltage appearing on line 18.

There are several difficulties and shortcomings of the PA EER system 100. First, limiters that sufficiently remove the AM of the RF input signal are difficult to realize. The difficulty increases as the operating frequency increases. Second, the voltage supply control circuit 6 and the filter 8 are substantially a switching power supply. These circuits typically consume much power that ultimately factors into and subtracts from the overall efficiency of the PA EER system. Third, it is difficult to develop a voltage supply control circuit 6 that meets the bandwidth requirements necessary for the voltage supply control circuit 6 to follow the AM evelope of wide band systems such as code division multiple access (CDMA) cellular telephone systems. For example, the envelope signal appearing at input 16 is generated by decomposing the RF signal appearing at input 12 into separate AM and PM signals. The decomposed AM signal has significantly higher bandwidth than the composite signal, and the voltage supply control must operate at the bandwidth of the decomposed AM signal. For many of the third generation cellular systems, switching speeds in the range of approximately 20 MHz could be required for such a PA EER system. And finally, the PA EER system 100 is expensive to produce. The filter 8 requires several components including at least one large inductor. These parts tend to add considerable cost and size to the portable radiotelephone, and since portable radiotelephones are many times a commodity product, price is a critical parameter.

Another technique for improving the efficiency of power amplifiers is called Envelope Following (EF). A simplified block diagram of an EF system is shown in FIG. 2. The PA EF system 200 includes a power amplifier 30 coupled to antenna 40 in the RF path and a voltage supply control circuit 32 coupled through filter 34 to the power amplifier 30 on the supply path.

An RF signal having AM and PM modulation components appearing at input 38 is applied to the power amplifier 30. In addition, an envelope signal containing information about the AM envelope of the RF signal at input 38 is applied through input 42 to the voltage supply control circuit 32. Once again, the voltage supply control circuit 32 and the filter 34 are in essence a switching power supply. A substantially constant supply voltage is applied to the voltage supply control circuit 32 through input 36.

In this system, the AM is not removed from the RF signal appearing at input 38. Rather, the supply voltage supplied to the PA 30 through line 44 is reduced or increased responsive to the amplitude of the AM envelope. The Supply voltage applied to the power amplifier 30 thus follows the AM envelope of the RF signal applied to the power amplifier 30. By modulating the supply voltage to the power amplifier 30 to follow the AM envelope, less power is consumed overall. For example, when the envelope is at a peak, the supply voltage to the power amplifier 30 is increased, but when the envelope is at a minimum, the supply voltage decreases, thereby saving power. This significantly increases the efficiency of the power amplifier 30.

Since the actual AM on the output signal produced by the power amplifier 30 does not originate in the voltage supply control circuit 32, some of the bandwidth requirements on the voltage supply control circuit 32 and filter 34 are reduced relative to the PA EER 100. This system also eliminates the need for a high frequency limiter. However, PA EF system 200 still requires a voltage supply control circuit 32 and filter 34, which adds significant cost and size to a portable radiotelephone.

Accordingly, there is a need for power amplifier systems operable in linear modulation systems. There is a further need for these linear power amplifier systems to be efficient so as to minimize current drain for operation in portable radiotelephones. There is a further need to minimize the cost of producing linear power amplifier systems in order to make the portable radiotelephones that utilize the power amplifier systems price competitive.

DETAILED DESCRIPTION OF THE PREFERRED EMBODIMENTS

Figure 1:
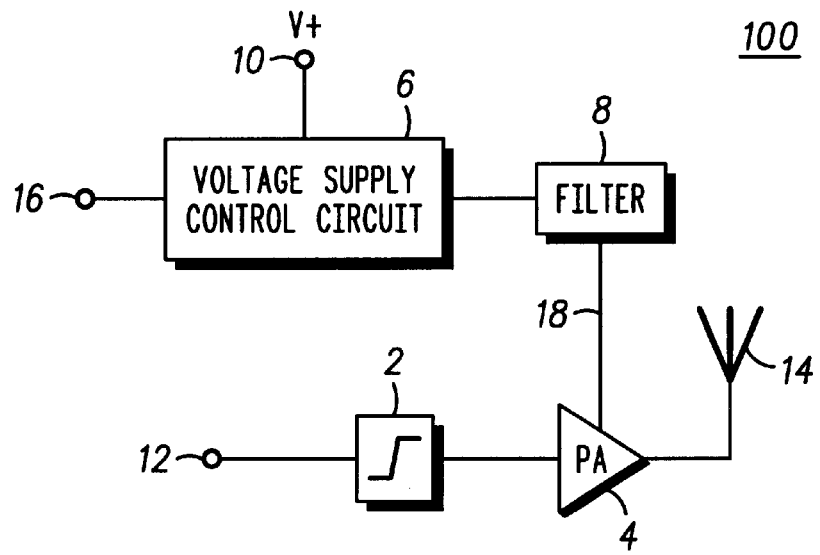
FIG. 1 is a block diagram of a prior art envelope elimination and restoration (EER) system.
Figure 2:
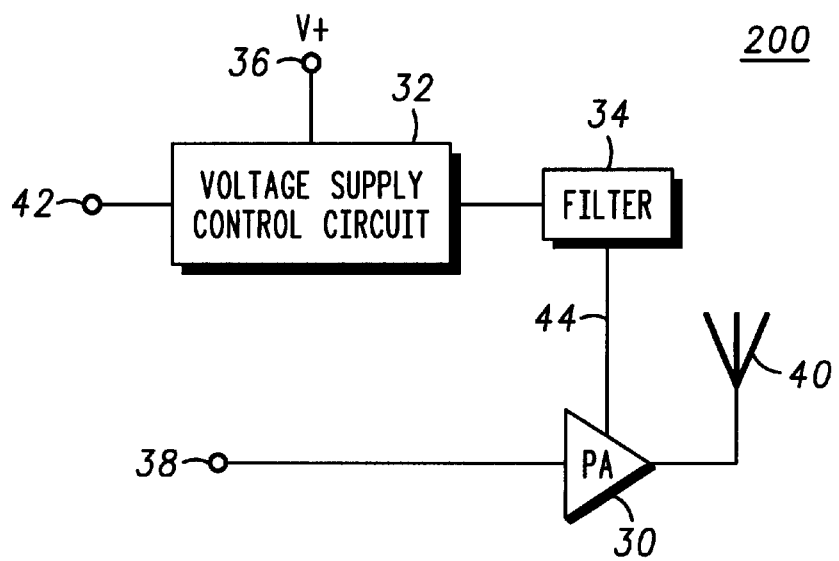
FIG. 2 is a block diagram of a prior art envelope following (EF) system.
Figure 3:
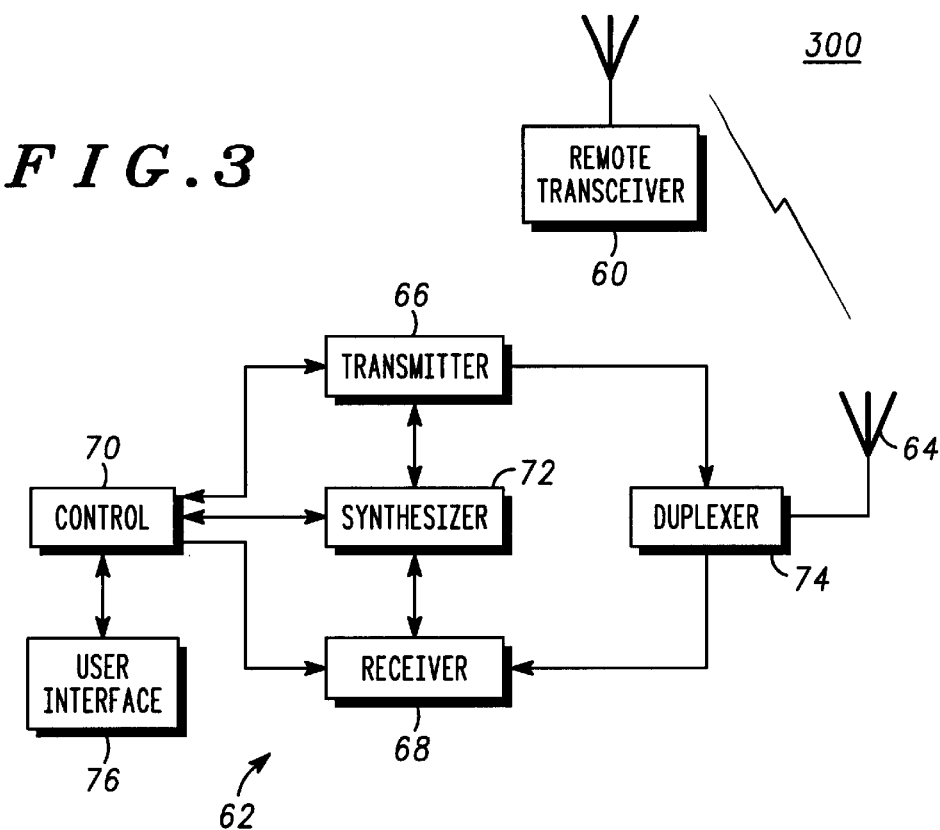
FIG. 3 is a block diagram of a radiotelephone having a receiver and a transmitter.

FIG. 3 is an illustration in block diagram form of a radiotelephone communication system 300. The radiotelephone communication system 300 includes a remote transceiver 60 and one or more radiotelephones such as radiotelephone 62. The remote transceiver 60 sends and receives RF signals to and from the radiotelephone 62 within a designated geographic area.

The radiotelephone 62 includes an antenna 64, a transmitter 66 (also referred to as a radio frequency transmitter), a receiver 68, a control block 70, a synthesizer 72, a duplexer 74, and a user interface 76. To receive information, the radiotelephone 62 detects RF signals containing data through the antenna 64 and produces detected RF signals. The receiver 68 converts the detected RF signals into electrical baseband signals, demodulates the electrical baseband signals, recovers the data, including automatic frequency control information, and outputs the data to the control block 70. The control block 70 formats the data into recognizable voice or data information for use by the user interface 76. Typically the user interface 76 includes a microphone, a speaker, a display, and a keypad, and the user interface 76 is for receiving user input information and presenting received data that was transmitted by remote transceiver 60. The receiver includes circuitry such as low noise amplifiers, filters, down conversion mixers and quadrature mixers, and automatic gain control circuitry, all known in the art.

To transmit RF signals containing information from the radiotelephone 62 to the remote transceiver 60, the user interface 76 directs user input data to the control block 70. The control block 70 typically includes any of a DSP core, a microcontroller core, memory, clock generation circuitry, software, and a power amplifier control circuit. The control block 70 formats the information obtained from the user interface 76 and conveys it to the transmitter 66 for conversion into RF modulated signals. The transmitter 66 conveys the RF modulated signals to the antenna 64 for transmission to the remote transceiver 60. Thus, the transmitter 66, also referred to as an RF transmitter, is for transmitting a modulated information signal. The duplexer provides isolation between the signals transmitted by the transmitter 66 and received by the receiver 68.

The synthesizer 72 provides the receiver 68 and the transmitter 66 with signals, tuned to the proper frequency, to allow the reception and transmission of information signals. Control over functions of the receiver 68 and the transmitter 66, such as channel frequency, is provided by the control block 70. Thus, the control block 70 provides the synthesizer 72 program instructions for frequency synthesis.

Figure 4:
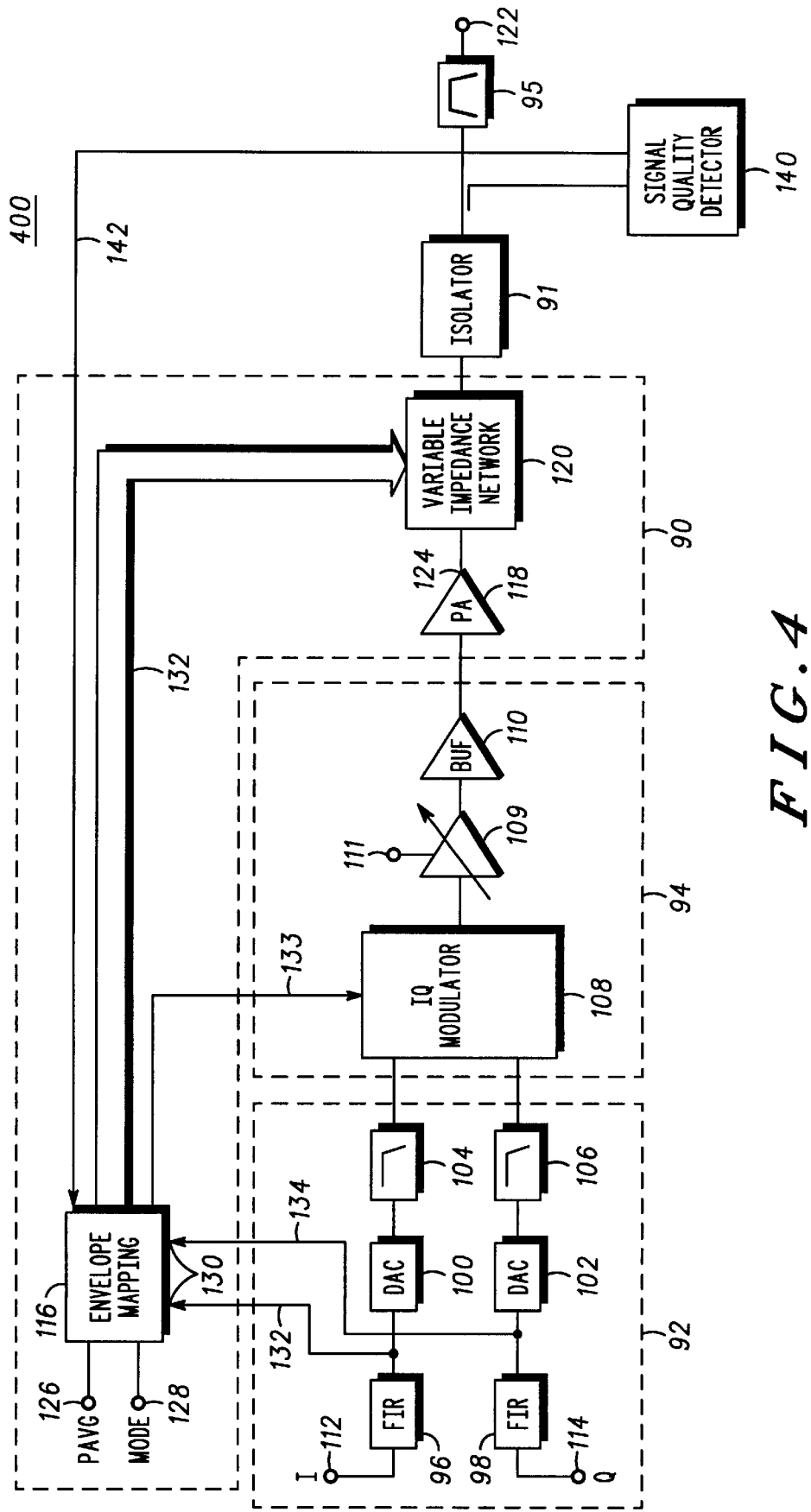
FIG. 4 is a block diagram of a load envelope following (LEF) system for use in the transmitter of FIG. 3.

FIG. 4 is a block diagram of a transmitter that can be used for the radiotelephone 62. The transmitter 400 employs a power amplifier load envelope following (PA LEF) system 90 for efficient operation in a linear modulation scheme.

In FIG. 4, the transmitter 400 is partitioned into base-band circuitry 92, radio frequency (RF) circuitry 94, the PA LEF system 90, and a filter 95. The base-band circuitry 92 and the RF circuitry 94 can be collectively referred to as transmitter circuitry. The filter 95 is of conventional design and may alternatively be incorporated into the duplexer 74 (FIG. 3).

The base-band circuitry 92 includes a first finite impulse response (FIR) filter 96, a second FIR filter 98, a first digital-to-analog (DAC) converter 100, a second DAC 102, a first anti-alias filter 104, and a second anti-alias filter 106. All of the circuits shown as the baseband circuitry 92 in FIG. 4 are of conventional design. Other configurations of the baseband circuitry 92 can be utilized without the use of the inventive faculty. Further, at least a portion of the baseband circuitry can be realized using circuitry within the control block 70 of FIG. 3.

The RF circuitry 94 includes an in-phase and quadrature phase (IQ) modulator 108 coupled to a variable gain element, here variable gain amplifier (VGA) 109. The VGA 109 is coupled to a buffer amplifier 110. The IQ modulator contains a mixer pair that receives an in-phase baseband signal (I) appearing at first baseband input 112, a quadrature-phase baseband signal (Q) appearing at second baseband input 114, an in-phase intermediate frequency (IF) carrier signal (not shown), and a quadrature phase IF carrier signal (not shown). The IQ modulator also contains an up-conversion mixer coupled to the mixer pair for converting the IF modulated signal to an RF signal. The IQ modulator 108, the VGA 109, and the buffer amplifier 110 are also of conventional design.

The PA LEF system 90 includes an envelope mapping circuit 116, a power amplifier 118, and a variable impedance network 120. The power amplifier 118 can be a single stage amplifier or a multi-stage amplifier.

The path from the first baseband input 112 and the second baseband input 114 to the RF output 122 is typically referred to as the RF path. Modifications and/or additions to the RF path can be made. For example, in the illustrated embodiment an upconversion mixer with associated IF filters are included in the RF path (e.g. within the IQ modulator 108) for frequency selectivity. Alternatively, the IQ modulator can convert baseband signals directly to the transmit RF, thereby forming a direct launch transmitter.

Circuitry within the control block 70 (FIG. 3) converts user input to a digital I and Q signal that are applied to the first baseband input 112 and the second baseband input 114, respectively. The first FIR filter 96 and the second FIR filter 98 filters the I and Q signals to reduce the inter-symbol interference that would otherwise result from transmission over a transmission channel/medium. The first DAC 100 and the second DAC 102 convert the digital I and Q signals into I and Q analog signals. First anti-alias filter 104 and second anti-alias filter 106 filter the I and Q analog signals as is known in the art.

The IQ modulator 108 receives the I and Q analog signals, and quadrature modulates them to an IF modulated signal. An up-conversion mixer within the IQ modulator 108 then converts the IF modulated signal to an RF modulated signal. Both the IF modulated signal and the RF modulated signals typically contain amplitude modulation (AM) envelope and phase modulation (PM) in accordance with the modulation scheme utilized.

The RF modulated signal is applied to the VGA 109. In addition, average transmit power control circuitry (not shown) is coupled to the control block 70, the transmitter circuitry, and the PA LEF system 90. The average transmit power control circuitry is for generating an automatic output control (AOC) signal as is known in the art. In the illustrated embodiment, the control block 70 (FIG. 3) contains the average transmit power control circuitry. The VGA 109 receives at VGA control input 111 the AOC signal for setting the gain of the VGA 109. By varying the gain of the VGA 109, the radiotelephone 62 (FIG. 3) can vary its average transmitted output power (and thus the average amplitude of the modulated signal).

In an alternative embodiment, the VGA 109 is a multi-stage variable gain amplifier so that several stages of gain can be altered. The multiple stages of variable gain amplification can also be distributed along different portions of the transmit path. Further, at least some of the necessary variable gain can be achieved through the use of a variable attenuator rather than a variable gain amplifier as is know in the art.

The control block 70 can generate the AOC signal in response to radiotelephone 62 making received signal strength measurements (e.g. open loop power control). The remote transceiver 60 can also send the radiotelephone 62 a power control command, and the control block 70 generates the AOC signal at least in part responsive to the remote transceiver 60 power control command (e.g. IS-95 CDMA closed loop power control). In addition, the control block 70 can generate the AOC signal using a combination of open loop and closed loop power control.

The RF signal produced by the VGA 109 is coupled to the buffer amplifier 110 for signal amplification. This amplifier increases the maximum gain through the RF path so that a maximum necessary output power can be achieved when necessary. As at the output of the IQ modulator 108, the buffered signal contains an amplitude modulation (AM) envelope and phase modulation (PM) in accordance with the modulation scheme utilized. The buffered signal is coupled to the power amplifier 118 as a power amplifier input signal. The power amplifier 118 produces an amplified version of the power amplifier input signal at power amplifier output 124. The supply voltage (not shown) applied to the power amplifier 11 8 is substantially constant in that the power amplifier supply voltage is not purposely varied in response to the AM envelope. Thus, the power amplifier 118 is biased to have sufficient current and voltage headroom in order to provide substantially linear amplification at even the highest output power levels.

With the substantially constant bias applied to the power amplifier 118, the variable impedance network 120 provides a variable load impedance to the power amplifier output 124 to alter the load line of the power amplifier 118 in response to the envelope of the transmitted signal. This increases the overall efficiency of the power amplifier 118 and reduces dissipated power.

Envelope mapping circuit 116 is a signal processor and can be realized with, for example, a DSP or an application specific integrated circuit (ASIC). Envelope mapping circuit technology is generally known to those skilled in the art. An example of an envelope mapping circuit is described in U.S. Pat. No. 5,420,536. Other envelope mapping circuit implementations can be utilized as is known in the art.

An average power level signal generated by the control block 70 (FIG. 3), designated $P_{AVG}$ in FIG. 4, is applied to power level input 126. The average power level signal contains information as to the desired transmit power level and is thus a derivative of the AOC signal.

The average power level signal is used by the envelope mapping circuit 116 for a mapping process. For a particular output power level, there exists an optimum output impedance for the power amplifier 188 to have the highest efficiency. When the transmit power level is changed by varying the gain of the VGA 109, a different optimum impedance must be presented to the power amplifier output 124. Thus, the envelope mapping circuit 116 must produce a load control signal on bus 132 responsive not only to the amplitudes of the I and Q signals, but also responsive to the average transmit power level.

For example, when the radiotelephone 62 is used for an IS-95 code division multiple access (CDMA) cellular telephone system, the average transmit power must vary from −50 dBm to +24 dBm in 1 dB steps. This dynamic range is achieved at least in part by the VGA 109. However, because of the OQPSK modulation in IS-95, the transmitted signal has an AM envelope with an amplitude that varies from −40 dB to 5.6 dB, with 0 dB variance being the median output level for a particular average output power setting. Thus, if the transmit power level is set to 24 dBm, the amplitude of the modulation envelope varies from −16 dBm to 29.6 dBm. A group of settings are contained in the envelope mapping circuit 116 so that the load control signal can adjust the variable impedance network 120 in response to I and Q signals detected on lines 132 and 134, respectively. These settings are specific to detected I and Q values when the transmit power level is 24 dBm.

When a different average transmit power is selected, such as −50 dBm, the average power level signal appearing at power level input 126 reflects this change. With the OQPSK modulation, the transmitted signal now has an AM envelope with an amplitude that varies from −90 dBm to 44.4 dBm. The envelope mapping circuit 116 now produces a load control signal on bus 132 to adjust the variable impedance network 120 responsive to the amplitude and phase of the I/Q signals and the new transmit power level.

The control block 70 (FIG. 3) also generates a mode signal that is applied to the mode input 128 of the envelope mapping circuit 116. The mode signal is for selecting the mode of operation of the transmitter 400. For example, the radiotelephone 62 can be a multi-mode phone operable in a CDMA mode and an AMPS mode. The mode signal causes the envelope mapping circuit 116 to produce the load control signal on bus 132 that causes the variable impedance network 120 to operate in accordance with the particular mode that the radiotelephone 62 is operating in.

If the radiotelephone 62 is operating in the AMPS mode, the load control signal on bus 132 would be dependent substantially only on the desired average transmit power level. This is because in the AMPS mode, the transmit signal is a constant envelope signal resulting from frequency modulation.

The envelope matching circuit 116 continuously generates a load control signal responsive to the detected amplitude and phase of the baseband I and Q signals, the desired average transmit power level, and the radiotelephone mode of operation, The load control signal thus represents, in accordance with the mode of operation selected, the dynamic amplitude and phase of the I and Q baseband signals as well as the desired average transmit power level of the radiotelephone 62. The load control signal can be either a digital signal, an analog waveform, or a combination of analog and digital waveforms that contains information about the instantaneous absolute power level of the transmitter. The envelope mapping circuit 116 cam perform the envelope mapping function algorithmically or as a look-up table.

In addition, a method of transmitting user input information comprises converting the user input information into an input signal, modulating a carrier wave signal with the input signal to form a modulated signal having an amplitude modulation (AM) envelope, amplifying the modulated signal having an AM envelope with a power amplifier, and varying a load impedance at an output of the power amplifier substantially in harmony with the AM envelope.

FIG. 4 shows that the transmitter 400 can optionally include an isolator 91 coupled to the output of the variable impedance network 120. The isolator presents a substantially constant impedance to the output of the variable impedance network 120. This will provide extra predictability to the various impedances that the variable impedance network 120 provides to the power amplifier output 124.

FIG. 4 also shows the transmitter 400 can optionally have a distortion control line 133 coupling the envelope matching circuit 116 to the IQ modulator 108. This distortion control line 133 optionally allows for the introduction of predistortion onto an input signal before applying the input signal to the power amplifier 124.

The variable impedance network 120 presents various impedances to the power amplifier output to maximize power amplifier efficiency while still maintaining power amplifier linearity. Due to biasing of the power amplifier 118 and the various output loads presented, the power amplifier 118 operates as close as possible to saturation/compression to provide for maximum power amplifier 118 efficiency. Operating so close to saturation may cause the power amplifier 118 to introduce distortion onto the RF input signal. In addition, the variable impedance network 120 may introduce some level of amplitude and phase distortion to the signal. With an a priori knowledge of this distortion, either through measurements, calculations, or both, predistortion can be impressed upon the signal to be amplified in order to account for the distortion resulting from the power amplifier 118 and/or the variable impedance network 120.

The envelope mapping circuit 116 also contains distortion control circuitry for generating the distortion control signal on distortion control line 133. The distortion control signal can be an analog signal or a digital signal. In addition, the distortion control circuitry can be in a different portion of the radiotelephone 62 rather than within the envelope mapping circuit 116. For example, the distortion control circuitry can be within the control block 70 (FIG. 3).

FIG. 4 shows the distortion control line 133 coupling the envelope mapping circuit 116 to the IQ modulator 108 so that circuitry within the IQ modulator 108 introduces the pre-distortion signal. Alternatively, the distortion control signal can be applied to a different portion of the transmitter 400 circuitry, such as baseband circuitry 92 (FIG. 4) or circuitry within control block 70 (FIG. 3). The pre-distortion could then be introduced via the baseband circuitry 92 or via circuitry within the control block 70 (FIG. 3).

Thus, the radiotelephone 62 has digital processing circuitry (either within the envelope mapping circuit 116 of FIG. 4, the control block 70 of FIG. 3, or elsewhere within the radiotelephone 62) for converting user input information to an input signal. The radiotelephone 62 also includes transmit circuitry (here baseband circuitry 92 and/or RF circuitry 94) coupling the digital processing circuitry to the input of the power amplifier 118 for amplifying and modulating the input signal before applying the input signal to the signal amplifier. In addition, the radiotelephone 62 includes distortion control circuitry coupled to any of the digital processing circuitry, the transmit circuitry, and the envelope mapping circuit 116. The distortion control circuitry causes any of the digital processing circuitry and the transmit circuitry to introduce pre-distortion upon the input signal before applying the input signal to the power amplifier 118. The distortion control circuitry can be realized using a DSP, a micro-controller, or other circuitry.

Alternatively stated, distortion control circuitry is coupled to the envelope mapping circuit 116 and the transmit circuitry (here baseband circuitry 92 and/or RF circuitry 94). The distortion control circuitry is for generating a distortion control signal and coupling the distortion control signal to the transmit circuitry to cause the transmit circuitry to impress pre-distortion upon the input signal before applying the input signal to the power amplifier 118.

The introduction of pre-distortion is generally known to those skilled in the art. As an example, see U.S. Pat. No. 5,113,414. Other methods and systems to introduce pre-distortion can be utilized as is known in the art.

Interpolation can be used in the envelope mapping circuitry 116 to generate a load control signal that causes the variable impedance network 120 to vary over a substantially continuous range of impedances. Alternatively, the load control signal causes the variable impedance network 120 to vary in discrete steps the various impedances presented to the power amplifier output 124.

FIG. 4 also shows the transmitter 400 can optionally include a signal quality detector 140 coupled to the power amplifier output 124. Signal quality control line 142 directs a signal quality indication to the envelope mapping circuit 116. The signal quality detector 140 measures the peak to average ratio of the RF signal produced at the power amplifier output 124.

The output of the signal quality detector 140 is used by the envelope mapping circuit 116 to compensate for variances in circuitry in the RF path. For example, the power amplifier 118 performance varies over temperature. The power amplifier performance 118 also varies from part to part within different radiotelephones. The variable impedance network 120 performance may also vary due to temperature variations and part variations. All of these variations must be accounted for by setting the operating point of the power amplifier 118 to account for worst case conditions. For example, the power amplifier 118 might be biased to have a higher quiescent current to maintain linearity over worst case temperature and part variation conditions than would otherwise be necessary if no performance variations were possible. Having to account for these worst case conditions means the power amplifier 118 may have to be biased to expend additional DC power to maintain linearity over possible worst case conditions.

The inclusion of the signal quality detector 140 helps account for performance variations and thereby allows the power amplifier 118 used within each radiotelephone to operate closer to saturation, thereby maximizing power amplifier efficiency. The signal quality detector 140 monitors the peak to average ratio of the RF signal. Alternatively, the signal quality detector 140 can measure the amount of adjacent channel power (ACP) that the radiotelephone 62 (FIG. 3) transmits. Further details on the measuring of adjacent channel power are described in a co-pending U.S. patent application entitled "OFF-CHANNEL LEAKAGE POWER MONITOR APPARATUS AND METHOD," Ser. No. 08/968,625, filed Nov. 12, 1997, assigned to the assignee of the present invention, the disclosure thereof incorporated by reference. The signal quality detector 140 sends an indication of the peak to average ratio via signal quality control line 142 to the envelope mapping circuit 1 16. The envelope mapping circuit 116 uses the signal quality indication to adjust the variable impedance network 120, and the variable impedance network 120 controls the impedances presented to the power amplifier output 124 to maintain a constant peak to average ratio in the RF signal.

Figure 5:
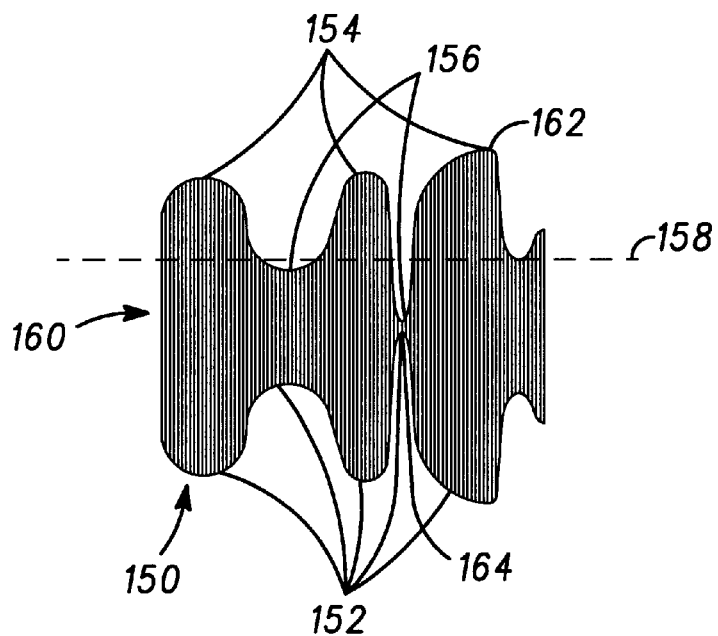
FIG. 5 shows the RF modulated signal produced by the LEF system of FIG. 4.
Figure 6:
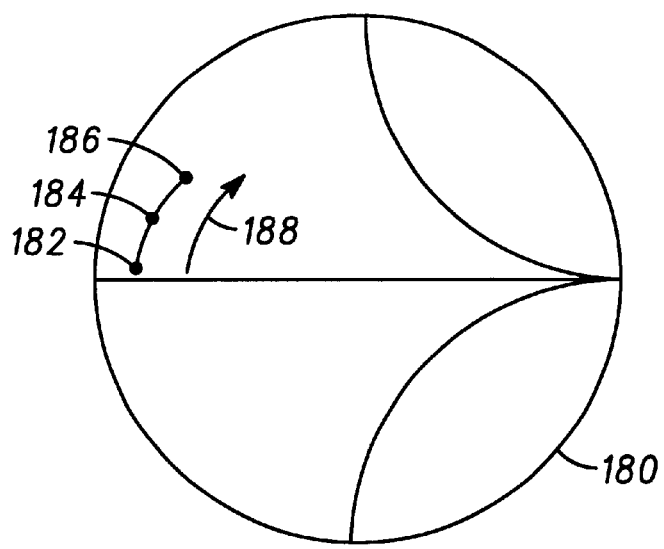
FIG. 6 is a Smith Chart showing three different optimum impedances to be presented to a power amplifier used in the LEF system of FIG. 4 corresponding to three instantaneous power levels.

Varying the impedances presented to the power amplifier output 124 can be understood more with reference to FIGS. 5 and 6. FIG. 5 shows the RF modulated signal 150 that is produced at the power amplifier output 124 of FIG. 4. The input signal to the power amplifier 118 (FIG. 4) has an AM envelope, and the RF modulated signal 150 (FIG. 5) is an amplified version of the input signal having an AM envelope 152. Due to the various linear modulation schemes, the amplitude of the AM envelope continuously varies and thus produces peaks 154 and valleys 156. The average transmit power level, as indicated by the dashed line 158, is in between the peaks 154 and the valleys 156. The modulation is carried by an RF carrier signal 160.

As discussed previously, the variable impedance network 120 (FIG. 4) is continuously adjusted to present a substantially optimum impedance to the power amplifier output 124 (FIG. 4). This maximizes the power amplifier 118 efficiency for the different amplitude excursions along the AM envelope 152 (FIG. 5) and for the different average transmit power levels.

FIG. 6 shows a Smith Chart showing three different optimum impedances to be presented to the power amplifier output 124 (FIG. 4) corresponding to three instantaneous power levels. Thus first impedance point 182, second impedance point 184, and third impedance point 186 represent impedances at a single carrier frequency but at different power levels at the power amplifier output 124. First impedance point 182 corresponds to peak power point 162 (FIG. 5), second impedance point 184 corresponds to average transmit power level (indicated by dashed line 158 of FIG. 5), and third impedance point 186 corresponds to minimum power point 164. By continuously varying the load impedance presented to the power amplifier output 124, the load impedance corresponding to the best power amplifier 118 efficiency can be continuously presented to the power amplifier 118 as the amplitude of the AM envelope 152 changes. The overall efficiency of the power amplifier 118 is thus increased.

Referring to FIGS. 5 and 6, the second impedance point 184 corresponds to average power point 163 (FIG. 5). If, due to temperature and/or part variations, a measured peak to average ratio is greater than a predetermined, desired, peak to average ratio, a different impedance is selected along the impedance set denoted by impedance points 182 through 186. A different impedance is selected by moving along the impedance set on the Smith chart in the direction shown by direction arrow 188. Thus, instead of using second impedance point 184 for a certain power level, the third impedance point 186 is used. This causes the power amplifier 118 to operate closer to saturation, thereby increasing amplifier efficiency. Likewise, if the peak to average ratio is less than desired, a different impedance is selected by moving along a set of impedances in a direction opposite the direction arrow 188, as shown on the Smith Chart 180 of FIG. 6.

The signal quality detector can be realized with diode detection circuitry and resistor-capacitor networks. FIG. 4 shows the signal quality detector sending a signal quality indication via signal quality control line 142 directly to the envelope mapping circuit 116. Alternatively, the signal quality indication can be coupled to other circuitry for processing, such as control block 70 (FIG. 3), and then coupled to envelope mapping circuit 116. Still further, analog circuitry such as operational amplifier circuitry (not shown) can receive the load control signal present on bus 132 and the signal quality indication present on signal quality control line 142. The analog circuitry can then process the two signals and generate a modified load control signal that is applied to the variable impedance network 120.

Figure 7:
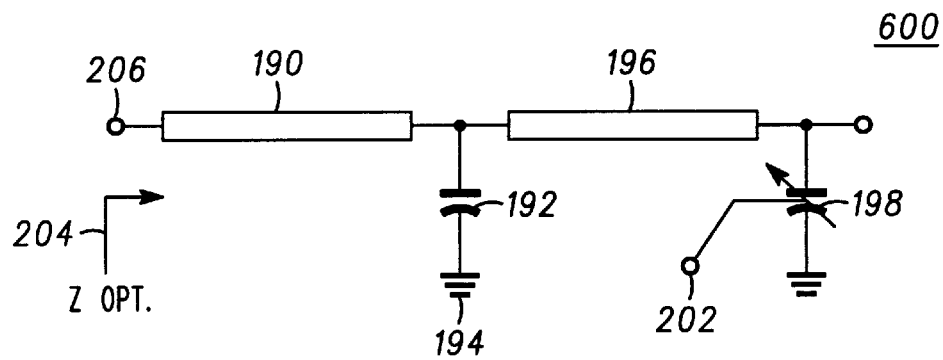
FIG. 7 shows a variable impedance network that can be used to present various impedances to the power amplifier.

FIG. 7 shows a first embodiment variable impedance network 600 that can be used to present various impedances to the power amplifier 118 (FIG. 4). The variable impedance network 600 includes first transmission line 190, fixed shunt capacitor 192 coupled to ground potential 194, second transmission line 196, and at least one variable element 198 coupled to ground potential 194. The variable element 198 can be selected from the group consisting of a varactor diode and a voltage variable capacitor. The load control signal is applied to input 202 as a voltage to vary the capacitance of the variable element 198. Arrow 204 shows that the impedance presented at input 206 is maintained to be substantially the optimum impedance for the power amplifier 118 (FIG. 4) for the various output power levels.

Other configurations of the variable impedance network 600 can be envisioned. For example, additional elements can be included, such as lumped element or distributed element inductors, additional transmission lines and capacitors, and additional variable elements.

Figure 8:
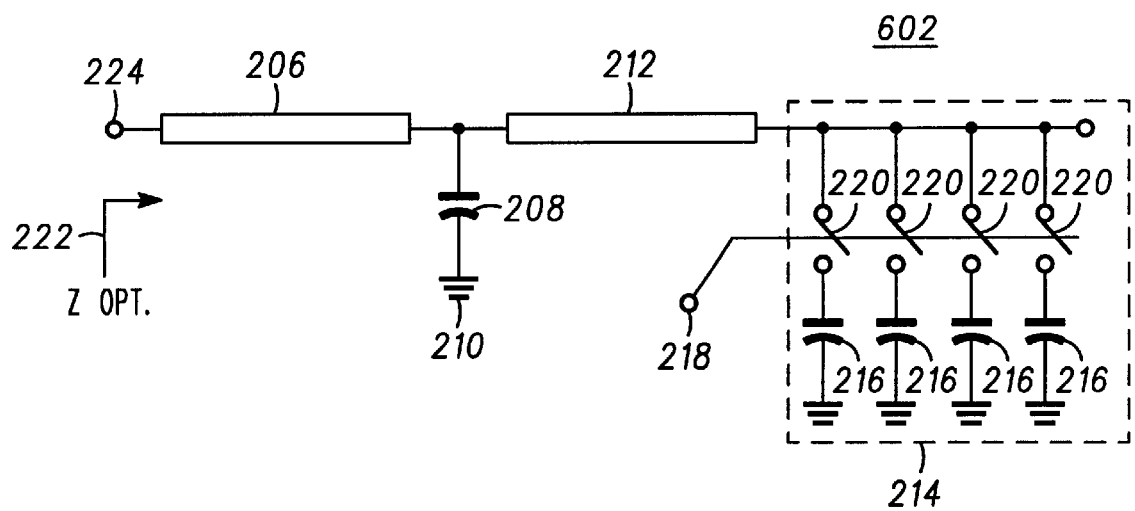
FIG. 8 shows a second embodiment variable impedance network.

FIG. 8 shows a second embodiment variable impedance network 602. The variable impedance network 602 includes first transmission line 206, a fixed shunt capacitor 208 coupled to ground potential 210, second transmission line 212, and at least one variable element 214 coupled to ground potential 210. The variable element comprises a plurality of capacitors 216 alternatively coupled and uncoupled to the power amplifier output 124 using PIN diodes or micro-mechanical switches. The load control signal is applied to input 218 to open and close a plurality of switches 220 coupling the plurality of capacitors 216 to the power amplifier output 124. Arrow 222 shows that the impedance presented at input 224 is maintained to be substantially the optimum impedance for the power amplifier 118 (FIG. 4) for the various output power levels.

Thus, the variable impedance network has at least one variable element. The variable element can be selected from the group consisting of a varactor diode, a voltage variable capacitor, and a plurality of capacitors alternatively coupled and uncoupled to the output of the signal amplifier using micro-electromechanical switches or PIN diodes.

Other configurations of the variable impedance network 602 can be envisioned without the use of the inventive faculty. For example, additional elements can be included, such as lumped element or distributed element inductors, additional transmission lines and capacitors, and additional variable elements. A combination of the variable impedance network 600 and the variable impedance network 602 could be used to increase the range of obtainable impedances. In addition, the load control signal can comprise multiple signals to separately control different variable impedance elements.

Figure 9:
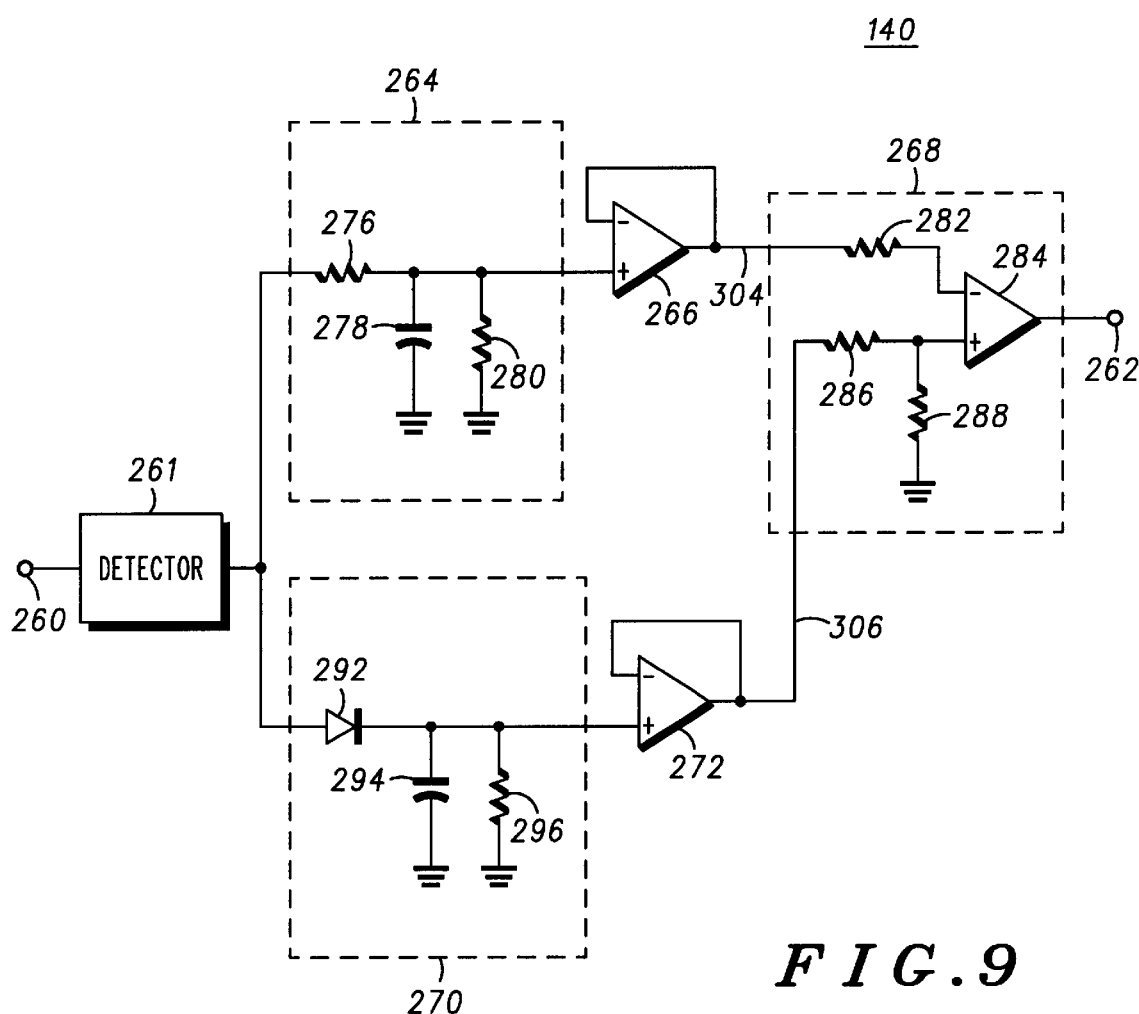
FIG. 9 is an example embodiment of a signal quality detector used in conjunction with the PA LEF system.

FIG. 9 is an example embodiment of a signal quality detector 140 used in conjunction with the PA LEF system 90. The signal quality detector 140 includes a conventional envelope detector 261, an averaging circuit 264, a first op-amp 266, a difference circuit 268, a peak detector 270, and a second op-amp 272.

The averaging circuit 264 includes a series resistor 276 coupled to a shunt capacitor 278 and a shunt resistor 280. The peak detector 270 includes a diode detector 292 coupled to a shunt capacitor 294 and a shunt resistor 296.

The difference circuit 268 has a first input 304 coupled through a series resistor 282 to the negative input of an op-amp 284. A second input 306 is coupled through a series resistor 286 and a shunt resistor 288 to a positive input of the op-amp 284. The output of the op-amp 284 is the signal quality detector output 262.

A sample of the output signal is applied to signal quality detector input 260, and the conventional envelope detector 261 produces a detected baseband signal with an AM envelope. The detected baseband signal is applied to the averaging circuit 264 and the peak detector circuit 270. The peak of the detected baseband signal is produced by the peak detector 270, whereas an average value of the detected baseband signal is produced by the averaging circuit 264.

First op-amp 266 and second op-amp 272 are voltage followers to provide isolation between the averaging circuit 264 and the difference circuit 268 and between the peak detector 270 and the difference circuit 268. The buffered average value is applied to first input 304 and the buffered detected peak of the signal is applied to second input 306.

The difference between the peak and average signal is produced at output 262, which is then sampled by an analog-to-digital (A-D) converter (not shown). The A-D converter can be within the envelope mapping circuit 116 (FIG. 4), within the control block 70 (FIG. 3), or elsewhere within the radiotelephone 62. The sampled difference is compared to a correlation table that gives the value of the peak-to-average ratio for the envelope. This sampling takes place at a very low rate since the sampling is of an averaged value. The envelope mapping circuit 116 adjusts the load impedance presented by the variable impedance network 120 until the monitored peak-to-average ratio is substantially equal to a pre-determined value.

In an alternate embodiment, the PA LEFF system 90 (FIG. 4) responds to only a portion of the AM envelope. This can be done to reduce the range of impedances necessary to follow the AM envelope. As an example, only the top 8 dB of the AM envelope is followed, so that the variable impedance network 120 presents impedances to the power amplifier 118 responsive to only the top 8 dB of the AM envelope.

Much of the high frequency amplitude information is contained in the valleys (e.g. minimums) 156 (FIG. 5) of the AM envelope. By using the PA LEF system to respond to only a portion of the AM envelope, the bandwidth of the load control signal can be significantly reduced. In addition, by using the PA LEF system to respond to only a top portion of the AM envelope, the power amplifier performance can be improved at the higher output powers, where the power amplifier draws the most current.

Figure 10:
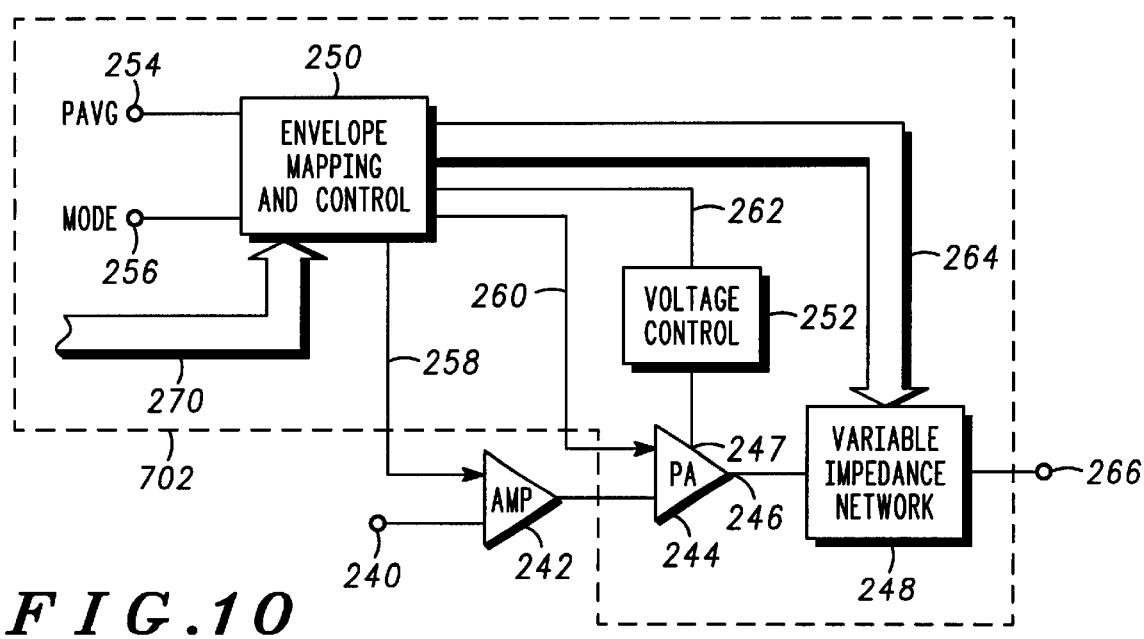
FIG. 10 is a block diagram exemplifying an alternate embodiment LEF system.

FIG. 10 shows a block diagram exemplifying a portion of a transmitter 700 incorporating an alternate embodiment PA LEF system 702. A driver ample 242 is coupled to power amplifier 244. The power amplifier output 246 is coupled to a variable impedance network 248. An envelope mapping and control circuit 250 is coupled to the driver amplifier 242, the power amplifier 244, and the variable impedance network 248. The envelope mapping and control circuit 250 is also coupled to the supply port 247 of the power amplifier 244 via a voltage control circuit 252.

An input signal having an AM envelope is applied to the system input 240, an indication of the average transmit power is applied to the envelope mapping and control circuit 250 via power level input 254, and an indication of the mode of operation is applied to the envelope mapping and control circuit 250 via mode input 256. In addition, a signal responsive to and indicative of amplitude and phase variations of the I and Q signals is applied to the envelope mapping and control circuit 250 via bus 270. The envelope mapping circuit 250 produces a load control signal on bus 264 that is responsive and indicative of the amplitude and phase variations of the I and Q signals.

The driver amplifier 242 provides preliminary signal amplification of the input signal, and the power amplifier 244 amplifies the input signal to a final transmit power level to produce an amplified signal. The variable impedance network 248 is coupled to receive the amplified signal and the load control signal. The load control signal causes the variable impedance network 248 to present various impedances to the power amplifier output 246 responsive to amplitude and phase variations of the I and Q signal.

In many applications, the transmitted output power is at the lower end of the available transmission power levels. For example, in the IS-95 CDMA cellular telephone system, the transmitted power range is +24 dBm to approximately −50 dBm. The portable radiotelephone statistically spends more time transmitting at the lower power levels than at the higher power levels.

If the supply voltage to the power amplifier is held substantially constant over the entire transmit power range, a sacrifice in power amplifier efficiency results. Lowering the supply voltage to the power amplifier 244 during lower transmit power levels, or even more aggressively during valleys in the AM envelope, will increase the overall efficiency of the system.

Thus, envelope mapping and control circuit 250 produces a supply voltage control signal on supply control line 262 in response to the signal at power level input 254. The supply voltage to the power amplifier 244 then varies with the desired average transmit power level. For example, as the transmit power increases towards the maximum value, the supply voltage at supply port 247 increases to its maximum voltage. The supply voltage control signal could also vary with the amplitude variations in the AM envelope for further increases in efficiency.

The voltage control circuit 252 is a linear or switching regulator. Since changing the supply voltage of the power amplifier 244 can affect the power amplifier 244 gain, phasing can be performed at the factory to compensate for and factor in the changes in gain.

For even more efficiency improvements, the DC currents in the driver amplifier 242 and/or the power amplifier 244 can be adjusted responsive to the desired average transmit power level. For example, as the average transmit power level is decreased, less current is needed in the driver amplifier 242 and the power amplifier 244 for them to remain linear. Therefore, the envelope mapping and control circuit 250 produces a first bias control voltage on line 258 and a second bias control voltage on line 260.

If the driver amplifier 242 is a field effect transistor (FET) amplifier, the first bias control voltage can be the gate voltage. Similarly, if the power amplifier 244 is a FET amplifier, the second bias control voltage can be the gate voltage. If bipolar devices are used, the bias control voltages can be, for example, base-emitter voltages.

As discussed with FIG. 4, optional features can be added to the PA LEF system 702. For example, an isolator can be placed at the output 266. In addition, pre-distortion can be added. Finally, a signal quality detector can be placed at the output to constantly monitor the output signal to maintain a predetermined peak-to-average ratio.

The previous description of the preferred embodiments are provided to enable any person skilled in the art to use the method of or make the apparatus for activating a spread-spectrum radiotelephone receiver. Various modifications to these embodiments will be readily apparent to those skilled in the art, and the generic principles defined herein may be applied to other embodiments without the use of the inventive faculty.

For example, the AM envelope can result from a modulation scheme used in a cellular telephone system selected from the group consisting of a time division multiple access (TDMA) system, a code division multiple access (CDMA) system, and a combination TDMA-CDMA system. Alternatively, the PA LEF system can be used in any radio transmission system having a modulation scheme that necessitates linear amplification or that produces an AM envelope on the carrier signal.

Additionally, a radiotelephone could transmit at substantially a single desired average power. In that instance, the load control signal is responsive to at least a top portion of the AM envelope. The load control signal is not responsive to changes in the desired average power level.

The PA LEF system provides for an efficient amplification system of a RF signal. The PA LEF system provides a cost-effective method of and system for amplifying a modulated signal having an AM envelope. Use in a radiotelephone provides for significant current savings at a lower cost compared to prior art systems. With the increased complexity of future generation radiotelephones, the PA LEF system used in a radiotelephone will provide a significant performance advantage over conventional radiotelephones.

We claim:

1. A radio frequency transmitter for transmitting a modulated information signal, the radio frequency transmitter comprising:
   a control circuit for converting user input information into an input signal and for providing an indication of a desired average transmit power;
   transmitter circuitry coupled to the control circuit for processing the input signal to form a modulated input signal having an amplitude modulation (AM) envelope; and
   a load envelope following power amplifier (LEF PA) system coupled to the transmitter circuitry, the LFP PA system including,
      a power amplifier coupled to receive the modulated input signal to produce an amplified signal at an output of the power amplifier,
      a variable impedance network coupled to receive the amplified signal and a load control signal, the load control signal causing the variable impedance network to continuously present various impedances to the output of the power amplifier,
      an envelope mapping and control circuit coupled to the variable impedance network, the control circuit, and the transmitter circuitry, the envelope mapping and control circuit coupled to receive the indication of the desired average transmit power and to produce the load control signal responsive to both amplitude variations of the AM envelope and the desired average transmit power, the envelope mapping and control circuit to produce a supply voltage control signal in response to the indication of the desired average transmit power, and
      a voltage control circuit for receiving the supply voltage control signal, producing a supply voltage responsive to the supply voltage control signal, and applying the supply voltage to the power amplifier.

2. A radio frequency transmitter for transmitting a modulated information signal, the radio frequency transmitter comprising:
   a control circuit for converting user input information into an input signal and for providing an indication of a desired average transmit power;
   transmitter circuitry coupled to the control circuit for processing the input signal to form a modulated input signal having an amplitude modulation (AM) envelope; and
   a load envelope following power amplifier (LEF PA) system coupled to the transmitter circuitry, the LEF PA system including,
      a power amplifier coupled to receive the modulated input signal to produce an amplified signal at an output of the power amplifier,
      a variable impedance network coupled to receive the amplified signal and a load control signal, the load control signal causing the variable impedance network to continuously present various impedances to the output of the power amplifier, and an envelope mapping and control circuit coupled to the variable impedance network, the control circuit, and the transmitter circuitry, the envelope mapping and control circuit coupled to receive the indication of the desired average transmit power to produce the load control signal responsive to both amplitude variations of the AM envelope and the desired average transmit power, the envelope mapping and control circuit to produce a bias control voltage directly proportional to the indication of the desired average transmit power, wherein the bias control voltage is applied to the power amplifier to cause a bias current of the power amplifier to vary in response to the indication of the desired average transmit power.

3. A load envelope following amplifier system, comprising:

a signal amplifier having an input for receiving an input signal having a amplitude modulation (AM) envelope, the amplifier for producing an amplified version of the input signal at an output;

a variable impedance network coupled to the output of the signal amplifier, the variable impedance network for presenting different impedances to the output of the signal amplifier responsive to a load control signal; and an envelope mapping circuit coupled to the variable impedance network and generating the load control signal as a function of at least the amplitude modulation envelope, only a portion of the AM envelope being used by the envelope mapping circuit for producing the load control signal.

4. The load envelope following amplifier system according to claim 3, wherein the portion of the AM envelope is the top portion of the envelope.

5. The load envelope following amplifier system according to claim 4, wherein the top portion is the top 8 dB of the envelope.

6. The load envelope following amplifier system according to claim 3, wherein the variable impedance network includes a variable capacitance.

7. The load envelope following amplifier system according to claim 3, further including:

transmitting circuitry coupled to the input of the signal amplifier; and distortion control circuitry coupled to the envelope mapping circuit and the transmit circuitry, wherein the distortion control circuitry causes the transmit circuitry to impress distortion upon the input signal before the input signal is input to the signal amplifier.

8. The load envelope following amplifier system according to claim 3, further including a signal quality detector coupled to the impedance network and monitoring the peak to average ratio of the amplified version of the input signal, the envelope mapping circuit generating the load control signal to cause the amplified version of the input signal to have a substantially constant peak to average ratio.

9. The load envelope following amplifier system according to claim 3, further including a signal quality detector coupled to the impedance network and monitoring adjacent channel power, the envelope detector generating the load control signal to cause the signal amplifier and impedance network to produce less than a predetermined level of adjacent channel power.

10. A method of operating a radiotelephone multimode radio frequency transmitter including a signal amplifier, an impedance network, and an envelope mapping circuit comprising the steps of:

receiving an input signal having an amplitude modulation envelope;

receiving a mode input indicating the operating mode of the radiotelephone;

receiving an average transmit power input representing the average transmit power;

amplifying the input signal in an amplifier to produce an amplified version of the input signal;

varying the impedance of an impedance network coupled to the amplifier responsive to a load control signal; and generating a load control signal responsive to the input signal, the mode input, and the average power level, the mapping circuit generating the load control signal as a function of the average power level in a first mode and as function of the input signal envelope and the average power level in a second mode.

11. The method as defined in claim 10, wherein the step of generating the load control signal includes generating the load control signal as a function of substantially only the desired average power level in the first mode.

12. The method as defined in claim 11, wherein the step of generating the load control signal includes generating the load control signal responsive to the amplitude and phase of the input signal and the average transmit power in the second mode.

13. The method as defined in claim 10, wherein the step of generating the load control signal includes generating the load control signal as a function of the amplitude and phase of the input signal and the average transmit power in the second mode.

14. The method according to claim 13, wherein only a top portion of the AM envelope is used by the envelope mapping circuit to generate the load control signal.

15. The method according to claim 10, wherein step of varying the impedance comprises varying the impedance in discrete steps.

16. The method according to claim 10, further including the step of distorting the input signal before amplifying the input signal in the signal amplifier.

17. The method according to claim 10, further including the steps of monitoring the peak to average ratio of the amplified version of the input signal output and controlling the amplified version of the input signal to have a substantially constant peak to average ratio.

18. A load envelope following amplifier system, comprising:

a signal amplifier having an input and an output, the input for receiving an input signal having a amplitude modulation (AM) envelope, the amplifier for producing an amplified version of the input signal;

a variable impedance network coupled to the output the signal amplifier, the variable impedance network for presenting different impedances to the output of the signal amplifier responsive to a load control signal;

a signal quality detector coupled to impedance network and monitoring the peak to average ratio of the amplified version of the input signal output; and an envelope mapping circuit coupled to the variable impedance network and the signal quality detector, the envelope detector generating the load control signal to cause the signal amplifier to produce the amplified version of the input signal with a substantially constant peak to average ratio.

19. The load envelope following amplifier system according to claim 18, wherein the envelope mapping circuit is responsive to at least the amplitude modulation envelope, the envelope mapping circuit producing the load control signal responsive to only a portion of the AM envelope.

20. The load envelope following amplifier system according to claim 19, wherein the portion of the envelope is the top portion of the AM envelope.

21. The load envelope following amplifier system according to claim 18, wherein the load control signal causes the variable impedance network to be varied in discrete steps.

22. The load envelope following amplifier system according to claim 18, wherein the variable impedance network includes a variable capacitance.

23. The load envelope following amplifier system according to claim 18, further including:

transmitting circuitry coupled to the input of the signal amplifier;

distortion control circuitry coupled to the envelope mapping circuit and the transmit circuitry, wherein the distortion control signal causes the transmit circuitry to impress distortion upon the input signal before the input signal is input to the signal amplifier.

24. The load envelope following amplifier system according to claim 18, further including a mode input, wherein the envelope mapping circuit generating the load control signal as a function of an average transmit power level control input in a first mode and as function of the input signal envelope and the average power level control input signal in a second mode.

25. The load envelope following amplifier system according to claim 24, wherein the step of generating the load control signal includes generating the load control signal dependent substantially only on the desired average power level in the first mode.

* * * * *

UNITED STATES PATENT AND TRADEMARK OFFICE
CERTIFICATE OF CORRECTION

PATENT NO. : 6,349,216 B1
DATED : February 19, 2002
INVENTOR(S) : Alberth et al.

Page 1 of 1

It is certified that error appears in the above-identified patent and that said Letters Patent is hereby corrected as shown below:

Column 14,
Line 25, change "LEP" to -- LEF --

Signed and Sealed this

Twenty-eighth Day of May, 2002

Attest:

Attesting Officer

JAMES E. ROGAN
Director of the United States Patent and Trademark Office